(12) United States Patent  
Miura

(10) Patent No.: US 9,691,757 B2  
(45) Date of Patent: Jun. 27, 2017

(54) SEMICONDUCTOR DEVICE INCLUDING TRANSISTORS AND DIODES AND A FIRST LINE EXTENDING BETWEEN THE TRANSISTORS AND DIODES

(71) Applicant: RENESAS ELECTRONICS CORPORATION, Kawasaki-shi (JP)

(72) Inventor: Yoshinao Miura, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 1 day.

(21) Appl. No.: 14/752,880

(22) Filed: Jun. 27, 2015

(65) Prior Publication Data

US 2016/0013179 A1 Jan. 14, 2016

(30) Foreign Application Priority Data

Jul. 8, 2014 (JP) ................................. 2014-140188

(51) Int. Cl.
| | |
|---|---|
| H01L 27/105 | (2006.01) |
| H01L 27/06 | (2006.01) |
| H01L 27/02 | (2006.01) |
| H01L 23/528 | (2006.01) |

(Continued)

(52) U.S. Cl.
CPC ...... *H01L 27/0629* (2013.01); *H01L 23/4824* (2013.01); *H01L 23/528* (2013.01); *H01L 27/0207* (2013.01); *H01L 27/0605* (2013.01); *H01L 21/8252* (2013.01); *H01L 2924/0002* (2013.01)

(58) Field of Classification Search
CPC ............. H01L 23/4824; H01L 27/0207; H01L 27/0629; H01L 27/0727; H01L 27/105
See application file for complete search history.

(56) References Cited

U.S. PATENT DOCUMENTS

| | | |
|---|---|---|
| 7,071,514 B1 | 7/2006 | Ozard |
| 8,581,301 B2 | 11/2013 | Saito et al. |
| 2011/0204447 A1 | 8/2011 | Wang et al. |

(Continued)

FOREIGN PATENT DOCUMENTS

| | | |
|---|---|---|
| JP | 2013-201242 A | 10/2013 |
| WO | WO 2010/081530 A1 | 7/2010 |
| WO | WO 2015/083887 A1 | 6/2015 |

OTHER PUBLICATIONS

Extended European Search Report dated Nov. 5, 2015.

*Primary Examiner* — Benjamin Sandvik  
*Assistant Examiner* — Leslie Pilar Cruz  
(74) *Attorney, Agent, or Firm* — McGinn IP Law Group, PLLC

(57) ABSTRACT

Reduction of the speed of switching between the drain electrodes of transistors and the cathode electrodes of diodes due to the inductances of lines coupling them is inhibited. Transistors and diodes are formed over a substrate. The transistors and the diodes are arranged in a first direction. The substrate also includes a first line, first branch lines, and second branch lines formed thereover. The first line extends between the transistors and the diodes. The first branch lines are formed to branch from the first line in a direction to overlap the transistors and are coupled to the transistors. The second branch lines are formed to branch from the first line in a direction to overlap the diodes and are coupled to the diodes.

20 Claims, 9 Drawing Sheets

(51) Int. Cl.
*H01L 23/482* (2006.01)
*H01L 21/8252* (2006.01)

(56) References Cited

U.S. PATENT DOCUMENTS

| | | |
|---|---|---|
| 2011/0220978 A1 | 9/2011 | Ikeda et al. |
| 2011/0266624 A1* | 11/2011 | Duvvury ............ H01L 27/0262 |
| | | 257/360 |
| 2013/0062625 A1 | 3/2013 | Takada |
| 2013/0248931 A1 | 9/2013 | Saito et al. |
| 2014/0035004 A1* | 2/2014 | Saito .................. H01L 27/0207 |
| | | 257/195 |

* cited by examiner

SEMICONDUCTOR DEVICE INCLUDING TRANSISTORS AND DIODES AND A FIRST LINE EXTENDING BETWEEN THE TRANSISTORS AND DIODES

CROSS-REFERENCE TO RELATED APPLICATIONS

The disclosure of Japanese Patent Application No. 2014-140188 filed on Jul. 8, 2014 including the specification, drawings and abstract is incorporated herein by reference in its entirety.

BACKGROUND

The present invention relates to a semiconductor device and, more particularly, to a technique applicable to semiconductor devices having transistors and wiring lines.

There are semiconductor devices having power control transistors. An example of such semiconductor devices is disclosed in Japanese Unexamined Patent Application Publication No. 2013-201242 (patent document 1). According to the patent document 1, in a semiconductor device including compound semiconductor layers, plural transistors are arranged in parallel with each transistor having a drain electrode and a source electrode extending in opposite directions. The drain electrodes and the source electrodes of the transistors are coupled to a single drain line and a single source line, respectively. The drain line and the source line extend in the direction in which the transistors are arranged.

The semiconductor device disclosed in the patent document 1 also includes diodes which are arranged along the transistors. The anode electrodes of the diodes extend in the same direction as the drain electrodes of the transistors and are coupled to the drain line. The cathode electrodes of the diodes extend in the same direction as the source electrodes of the transistors and are coupled to the cathode line. The source line and the cathode line are separated from each other, but they are linearly aligned.

SUMMARY

There are cases where, in a circuit including a power control transistor whose drain electrode is coupled to the cathode of a diode, switching is made between the transistor and the cathode to which electric current flows. When, in such cases, the line between the drain electrode of the transistor and the cathode electrode of the diode is long, the inductance of the line may lower the speed of switching between the drain electrode of the transistor and the cathode electrode of the diode. The above and other problems to be addressed and novel features of the present invention will become apparent from the following description of the present specification and the accompanying drawings.

According to an embodiment of the present invention, transistors and diodes are formed over a substrate. The transistors and the diodes are arranged in a first direction. The substrate also includes a first line, first branch lines, and second branch lines formed thereover. The first line extends between the transistors and the diodes. The first branch lines are formed to branch from the first line in a direction to overlap the transistors and are coupled to the transistors. The second branch lines are formed to branch from the first line in a direction to overlap the diodes and are coupled to the diodes.

According to the above embodiment of the present invention, the line between the drain electrode of each transistor and the cathode electrode of each diode can be shortened.

This inhibits the inductance of the line from lowering the speed of switching between the transistor and the cathode.

DETAILED DESCRIPTION

Embodiments of the present invention will be described below with reference to drawings. Throughout the attached drawings, like parts will be denoted by like reference symbols and their description will be omitted where appropriate to avoid duplication.

First Embodiment

Figure 1:
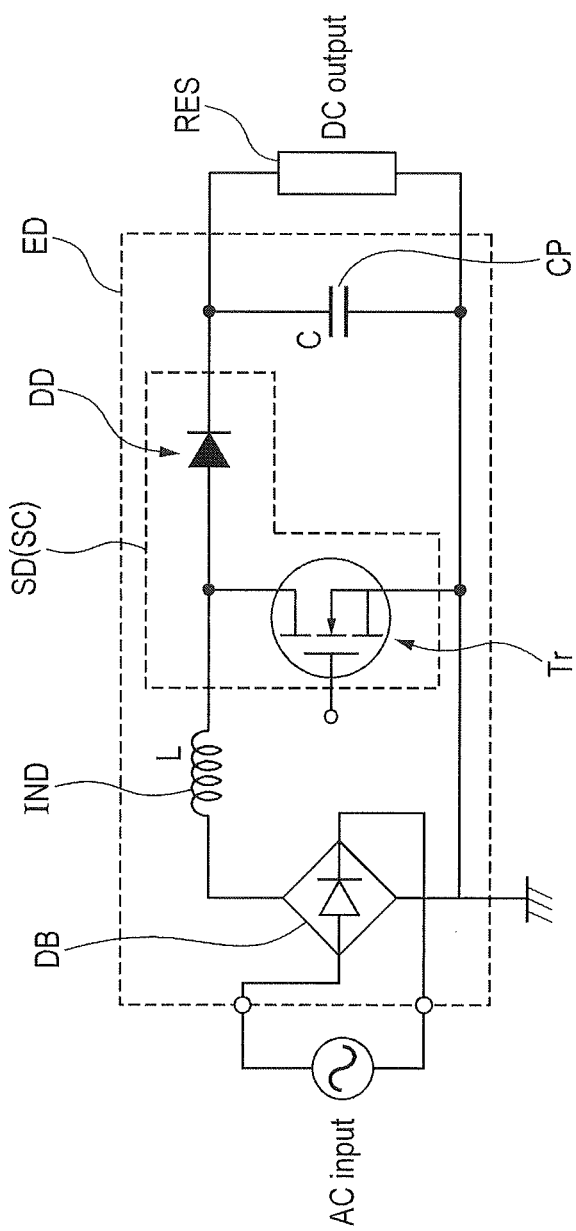
FIG. 1 is a circuit diagram of an electrical device according to a first embodiment of the present invention.

FIG. 1 is a circuit diagram of an electrical device ED according to a first embodiment of the present invention. The electrical device ED is a switching power supply which converts AC power to DC power. The electrical device ED includes a diode bridge DB, an inductor IND, a transistor TR, a diode DD, and a capacitor CP.

Two terminals of the diode bridge DB are coupled to an AC power supply. The remaining two terminals of the diode bridge DB are coupled to a load RES.

The transistor TR and the capacitor CP are coupled to the diode bridge DB in parallel with the load RES. The transistor TR is positioned closer to the diode bridge DB than the capacitor CP. The inductor IND is positioned between the diode bridge DB and the drain of the transistor TR. The diode DD is positioned between the drain of the transistor TR and the capacitor CP.

In the above circuit, the transistor TR and the diode DD are included in a semiconductor chip SC. The semiconductor chip SC configures, along with a chip mounting part DP, a first terminal LT1, a second terminal LT2, and a third terminal LT3 being described later, a semiconductor device SD.

Figure 2:
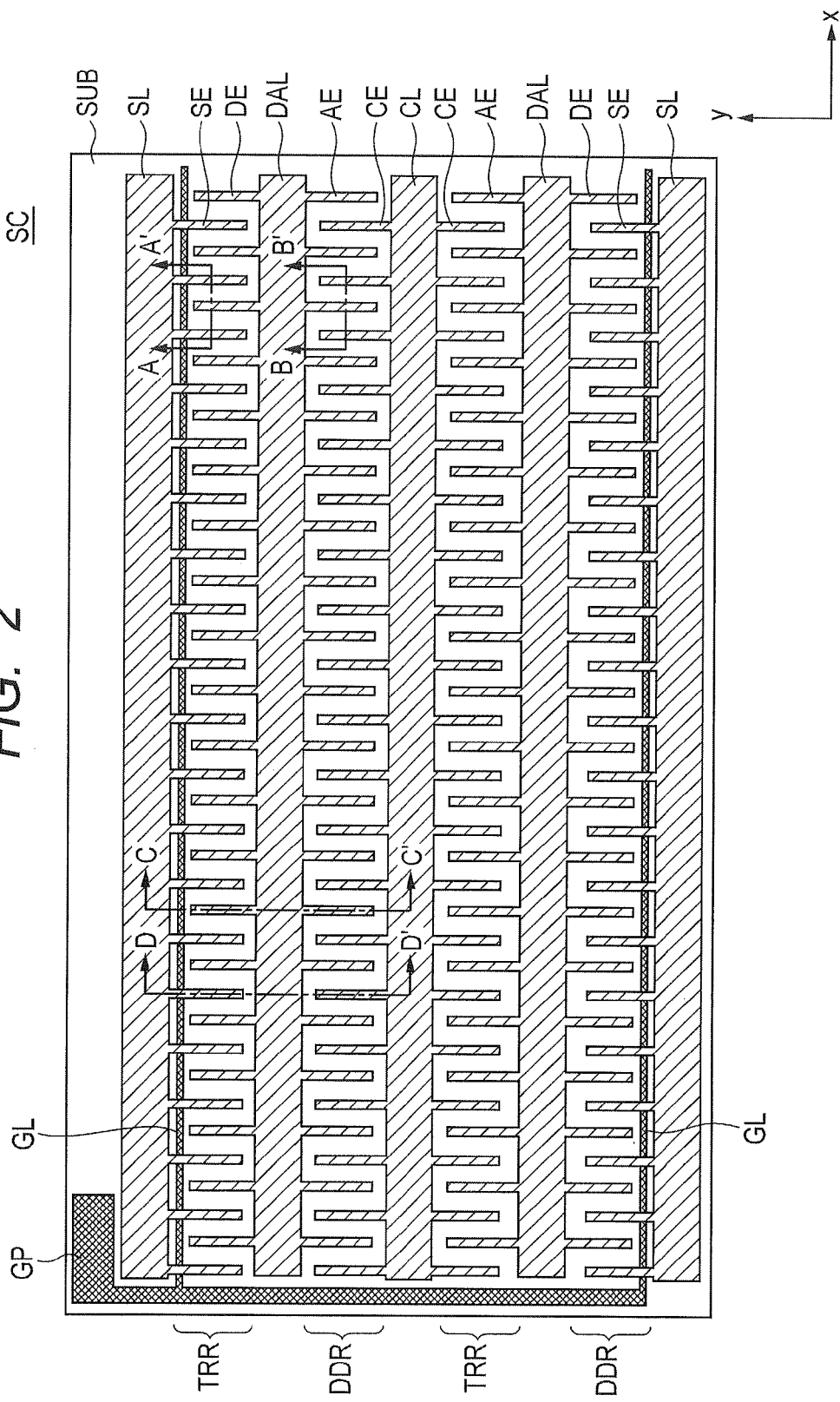
FIG. 2 is a plan view of a semiconductor chip.

FIG. 2 is a plan view of the semiconductor chip SC. The semiconductor chip SC is formed of a substrate SUB. The substrate SUB is, for example, rectangular and includes a source line SL (a second line), a drain anode line DAL (a first line), a cathode line CL (a third line), and a drain anode line DAL which are arranged in the mentioned order at intervals and repeatedly in a first direction (the y direction in FIG. 2). The last drain anode line DAL is adjacently followed by a source line SL with a space between them. These lines extend in a second direction crossing the first direction (e.g. in a direction perpendicularly crossing the first direction, i.e., in the x direction in FIG. 2).

Between each adjacent pair of a source line SL and a drain anode line DAL, a transistor region TRR is positioned. Between each drain anode line DAL and the adjacent cathode line CL, a diode region DDR is positioned. In each transistor region TRR, plural transistors TRs are arranged in the second direction (in the x direction in FIG. 2). In each diode region DDR, plural diodes DDs are arranged in the second direction. The transistors TRs are electrically coupled in parallel to function as one transistor. The diodes DDs are electrically coupled in parallel to function as one diode.

The substrate SUB further includes source electrodes SEs (third branch lines), drain electrodes DEs (first branch lines), anode electrodes AEs (second branch lines), and cathode electrodes CEs (fourth branch lines).

The source electrodes SEs are formed to branch from the source lines SLs. The source electrodes SEs branching from each source line SL extend toward the corresponding transistor region TRR. The drain electrodes DEs are formed to branch from the drain anode lines DALs. The drain electrodes DEs branching from each drain anode line DAL extend toward the corresponding transistor region TRR. Namely, the source electrodes SEs and the drain electrodes DEs extend in a direction to overlap the transistors TRs in the corresponding transistor regions TRRs. The source electrodes SEs and the drain electrodes DEs in each transistor region TRR are alternatingly arranged along the corresponding drain anode line DAL such that they overlap one another as seen in the x direction in FIG. 2. Thus, in each transistor region TRR, the drains and sources of the transistors TR are alternatingly arranged along the corresponding drain anode line DAL.

The anode electrodes AEs are formed to branch from the drain anode lines DALs. The anode electrodes AEs branching from each drain anode line DAL extend toward a diode region DDR. The cathode electrodes CEs are formed to branch from both sides of the cathode line CLs. The cathode electrodes CEs extending from each side of each cathode line CL extend toward the corresponding diode region DDR. Namely, the anode electrodes AEs and the cathode electrodes CEs in each diode region DDR extend in a direction to overlap the diodes DDs in the diode region DDR. The anode electrodes AEs and the cathode electrodes CEs in each diode region DDR are alternatingly arranged along the corresponding drain anode line DAL such that they overlap one another as seen in the x direction in FIG. 2. Thus, in each diode region DDR, the cathodes and anodes of the diodes DD are alternatingly arranged along the corresponding drain anode line DAL. With a diode region DDR positioned on each side of each cathode line CE, each cathode line CL has cathode electrodes CEs branching from both sides thereof.

In the example shown in FIG. 2, the source electrodes SEs and the cathode electrodes CEs are identical in their positions in the x direction in FIG. 2, and the drain electrodes DEs and the anode electrodes AEs are also identical in their positions in the x direction in FIG. 2. However, the positions in the x direction of the source electrodes SEs, drain electrodes DEs, cathode electrodes CEs, and anode electrodes AEs need not necessarily be as shown in FIG. 2.

The substrate SUB further includes a gate line GL and a gate pad GP. The gate pad GP is positioned, for example, in a marginal portion (e.g. a corner portion) of the substrate SUB. The gate line GL extends from the gate pad GP along an edge of the substrate SUB and branches to further extend along each transistor region TRR. The gate line GL branching into each transistor region TRR is coupled to the gate electrodes GEs (being described later) of the transistor TRs in the transistor region TRR. In each transistor region TRR, the gate line GL extends between the corresponding source line SL and the transistors TRs in the transistor region TRR. Namely, the gate line GL extends near the source line SL.

Figure 3:
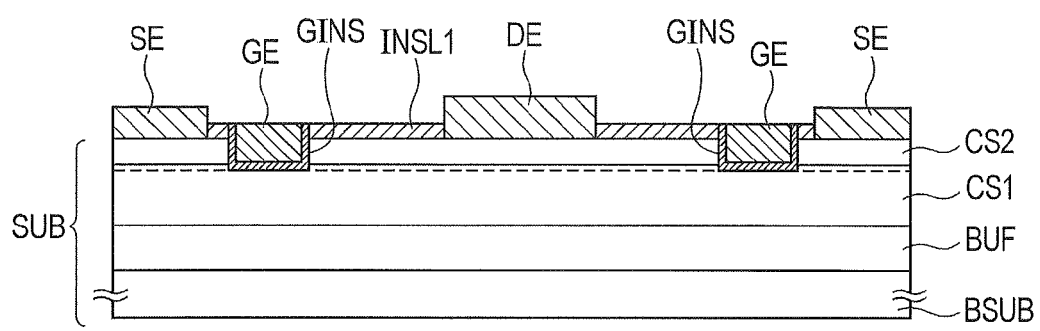
FIG. 3 is a sectional view taken along line A-A' of FIG. 2.

FIG. 3 is a sectional view taken along line A-A' of FIG. 2 to show the structure of each transistor TR. The substrate SUB includes, on a first substrate of a base substrate BSUB, a buffer layer BUF, a first compound semiconductor layer CS1, and a second compound semiconductor layer CS2 epitaxially grown in the mentioned order. The base substrate BSUB is, for example, a $p^+$ type bulk silicon substrate. The buffer layer BUF is a buffer formed between the first compound semiconductor layer CS1 and the base substrate BSUB. The buffer layer BUF is a nitride semiconductor layer formed by stacking layers of compound semiconductor, for example, AlN/GaN. The first compound semiconductor layer CS1 is a layer epitaxially grown over the buffer layer BUF. The first compound semiconductor layer CS1 becomes a channel layer of the transistor TR. The first compound semiconductor layer CS1 is formed of, for example, GaN, but it may be alternatively formed of a different nitride semiconductor layer such as AlGaN. The second compound semiconductor layer CS2 is formed of a material having a grating constant different from that of the first compound semiconductor layer CS1. The second compound semiconductor layer CS2 is formed of, for example, AlGaN. With the second compound semiconductor layer CS2 formed, a two-dimensional electron gas to serve as carriers is generated in the first compound semiconductor layer CS1.

The second compound semiconductor layer CS2 includes trenches. The trenches are formed to reach, through the second compound semiconductor layer CS2, into a surface layer of the first compound semiconductor layer CS1. This makes the transistor TR a normally-off transistor. Each of the trenches includes a gate insulating film GINS of the transistor TR formed over the bottom and side surfaces thereof. The gate insulating film GINS is amorphous $Al_2O_3$ or $SiO_2$. It is formed, for example, by an atomic layer deposition (ALD) method, sputtering method or chemical vapor deposition (CVD) method. The remaining space of the trench is filled with a gate electrode GE of the transistor TR. The gate electrode GE is formed of, for example, TiN, Au, or polysilicon (e.g., p-type polysilicon). The gate electrode GE thus formed may be overlaid with a layer of, for example, Al or Cu which is lower in resistance than the material forming the gate electrode GE.

The second compound semiconductor layer CS2 includes drain electrodes DEs and source electrodes SEs formed thereover. The drain electrodes DEs and source electrodes SEs are ohmically coupled to the second compound semiconductor layer CS2. Each drain electrode DE is coupled to the drain of a transistor TR. Each source electrode SE is coupled to the source of a transistor TR. Each pair of a drain electrode DE and a source electrode SE oppose each other across a gate electrode GE. In the example shown in FIG. 3, each gate electrode GE is closer to the source electrode SE than to the drain electrode DE so as to keep the gate-to-drain voltage resistance adequately high.

On the second compound semiconductor layer CS2, the regions where none of the source electrodes SEs, gate electrodes GEs and drain electrodes DEs is formed are covered with a protective insulating film INSL1 of, for example, SiN.

Figure 4:
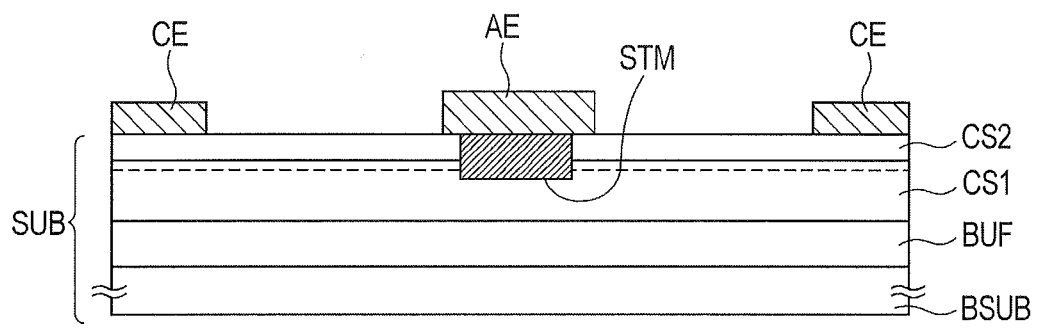
FIG. 4 is a sectional view taken along line B-B' of FIG. 2.

FIG. 4 is a sectional view taken along line B-B' of FIG. 2 to show the structure of each diode DD. Each anode electrode AE is coupled to the anode of a diode DD. Each cathode electrode CE is coupled to the cathode of a diode DD. The diode DD is a Schottky barrier diode which includes Schottky metal STM. The Schottky metal STM is buried in a trench formed in the second compound semiconductor layer CS2 to be under an anode electrode AE. The bottom of the trench reaches into the surface layer of the first compound semiconductor layer CS1, thereby making the distribution of the two-dimensional electron gas discontinuous. In other words, the two-dimensional electron gas distribution is made discontinuous by the interface between the Schottky metal STM and the second compound semiconductor layer CS2. The Schottky metal STM effects Schottky coupling between the first compound semiconductor layer CS1 and the second compound semiconductor coupling CS2. The Schottky metal STM is formed of, for example, at least one of Au, Ti, and polysilicon (e.g., p-type polysilicon). The Schottky metal STM may alternatively be formed of, for example, W, Pt, or Ni. The Schottky metal STM need not necessarily be buried in the trench. When not buried in the trench, the Schottky metal STM is formed over the second compound semiconductor layer CS2.

The diode DD is not limited to a Schottky barrier diode.

Figure 5:
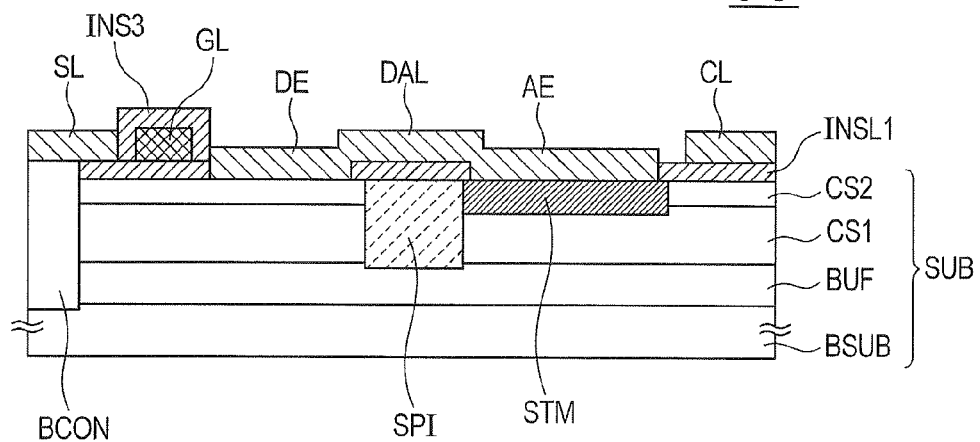
FIG. 5 is a sectional view taken along line C-C' of FIG. 2.

FIG. 5 is a sectional view taken along line C-C' of FIG. 2. As described with reference to FIG. 2, the drain electrodes DEs and the anode electrodes AEs are formed to branch from the corresponding drain anode lines DALs. Namely, the drain electrodes DEs and the anode electrodes AEs are formed integrally with the corresponding drain anode lines DALs. As described with reference to FIG. 4, Schottky metal STM is buried under each anode electrode AE.

Under each region of the substrate SUB where a drain anode line DAL is formed, an insulating separation layer SPI is buried. The insulating separation layer SPI is formed, for example, by injecting high-density boron (B) into the first compound semiconductor layer CS1 and the second compound semiconductor layer CS2. The insulating separation layer SPI is formed through the first compound semiconductor layer CS1 and the second compound semiconductor layer CS2 with the bottom thereof reaching a surface layer of the buffer layer BUF. Each insulating separation layer SPI separates a transistor region TRR and a diode region DDR. For example, with the insulating separation layers SPIs formed, when a high reverse bias voltage is applied to a cathode electrode CE in a diode region DDR, no current flows from the diode region DDR to the corresponding transistor TR.

In the example shown in FIG. 5, an insulating film INSL1 is formed between the insulating separation layer SPI and the drain anode line DAL, but the insulating film INSL1 need not necessarily be between the insulating separation layer SPI and the drain anode line DAL.

Under each region of the substrate SUB where a source line SL is formed, a buried contact BCON is formed. The upper surface of the buried contact BCON is in contact with a source line SL. The lower surface of the buried contact BCON is either in contact with or buried in the base substrate SUB. This couples the source line SL to the base substrate BSUB via the buried contact BCON. The current having flowed through the source line SL flows to outside via the buried contact BCON and the base substrate BSUB. The buried contact BCON is formed of, for example, n-type polysilicon.

Figure 6:
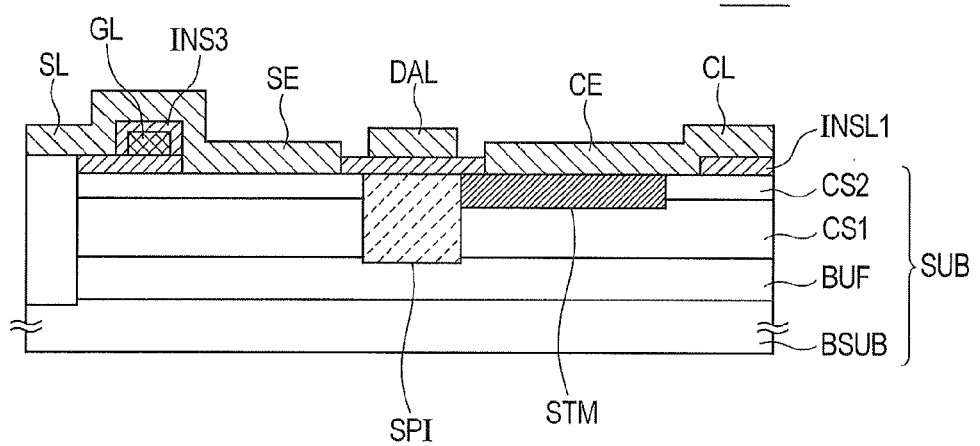
FIG. 6 is a sectional view taken along line D-D' of FIG. 2.

FIG. 6 is a sectional view taken along line D-D' of FIG. 2. As described with reference to FIG. 2, the cathode electrodes CEs are formed to branch from the cathode lines CLs and the source electrodes SEs are formed to branch from the source lines SLs. Namely, the cathode electrodes CEs and the corresponding cathode lines CLs are integrally formed, and the source electrodes SEs and the corresponding source lines SLs are integrally formed.

Also, as shown in FIG. 2, each source electrode SE crosses, in a planar view, a gate line GL. As shown in FIG. 6, the portion crossed by each source electrode SE of the gate line GL is covered with an insulating film INS3. The insulating film INS3 is, for example, a silicon oxide film. This prevents short-circuiting between each source electrode SE and the gate line GL.

How to manufacture the semiconductor device SD will be described in the following. First, a base substrate BSUB is prepared. Next, over the base substrate BSUB, a buffer layer BUF, a first compound semiconductor layer CS1, and a second compound semiconductor layer CS2 are epitaxially grown in the mentioned order. Next, an insulating separation layer SPI is formed through the second compound semiconductor layer CS2 and the first compound semiconductor layer CS1.

Next, trenches for burying Schottky metal STM are formed by partially removing the second compound semiconductor layer CS2. The Schottky metal STM is then buried in the trenches.

Next, over the second compound semiconductor layer CS2 and the Schottky metal STM, an insulating film INSL1 is formed by the CVD method. Then, to form trenches to bury gate insulating films GINSs and gate electrodes GEs, the insulating film INSL1 and the second compound semiconductor layer CS2 are partially removed. Next, an insulating film is formed in the trenches and over the second compound semiconductor layer CS2, for example, by the DVD method or the ALD method and, furthermore, a conducting film is formed by the sputtering method. Next, the insulating film and the conducting film are selectively removed. In this way, the gate insulating film GINS, gate electrodes GEs, gate lines GLs, and gate pad GP are formed.

Subsequently, over the insulating film INSL1 and the gate lines GLs, an insulating film is formed, then the insulating film is selectively removed to form an insulating film INS3. Next, buried contacts BCONs are formed in the substrate SUB. Next, the portions of the insulating film INSL1 where the source electrodes SEs, drain electrodes DEs, anode electrodes AEs, and cathode electrodes CEs are to be formed are removed. Next, a metal film, for example, Al is formed over the second compound semiconductor layer CS2, the insulating film INS3, the insulating film INSL1, and the buried contacts BCONs, then the metal film is selectively removed. In this way, the source electrodes SEs, source lines SLs, drain electrodes DEs, anode electrodes AEs, drain anode lines DALs, cathode electrodes CEs, and cathode lines CLs are formed.

Figure 7:
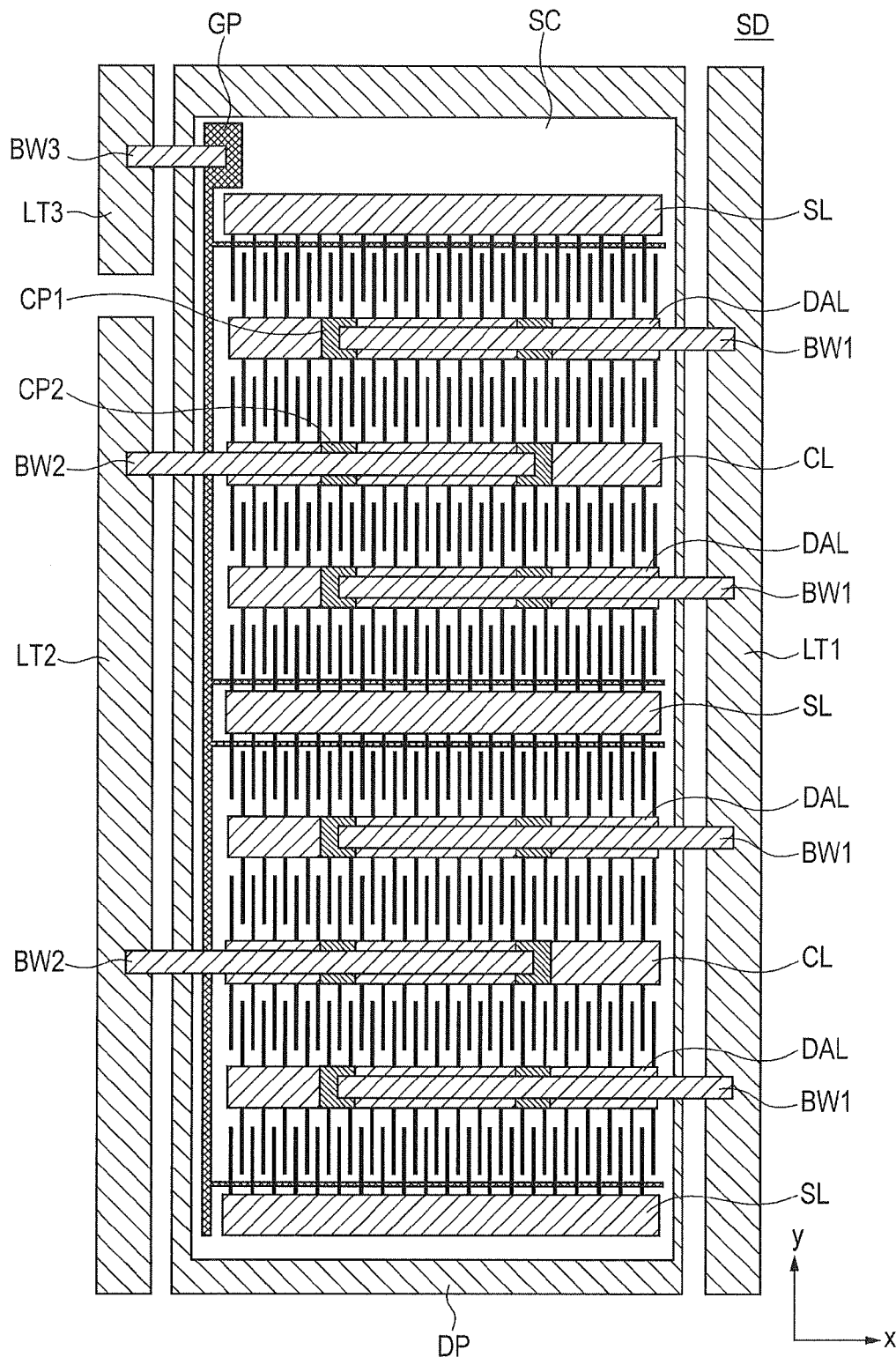
FIG. 7 is a plan view of a semiconductor device.

FIG. 7 is a plan view of the semiconductor device SD. As described with reference to FIG. 1, the semiconductor device SD includes a semiconductor chip SC. The semiconductor device SD further includes a chip mounting part (substrate mounting part) DP, a first terminal LT1, a second terminal LT2, and a third terminal LT3. The chip mounting part DP, the first terminal LT1, the second terminal LT2, and the third terminal LT3 are all conductive and are each formed, for example, as a lead frame. It is allowable that they are conductive only on their surface layers.

The semiconductor chip SC is mounted over the chip mounting part DP such that the surface opposite to the first surface of the base substrate BSUB is in contact with the chip mounting part DP. The base substrate BSUB is electrically coupled to the chip mounting part DP. As descried with reference to FIG. 5, each source line SL is coupled to the base substrate BSUB via a buried contact BCON. Therefore, the source electrodes SEs are electrically coupled to the chip mounting part DP via the source lines SLs, the buried contacts BCONs and the base substrate BSUB. Namely, the potentials of the source electrodes SEs are applied from the chip mounting part DP.

As described above, the substrate SUB is rectangular. Of the two sides extending in a direction to cross the source lines SLs, cathode lines CLs, and drain anode lines DALs (the sides extending in the y direction in FIG. 7), one side (a first side) is opposed by the first terminal LT1. The other side (a second side) is opposed by the second terminal LT2 and the third terminal LT3. The first terminal LT1 is coupled to the drain anode lines DALs via bonding wires BW1s (first coupling members). The second terminal LT2 is coupled to the cathode lines CLs via bonding wires BW2s (second coupling members). The third terminal LT3 is coupled to the gate pad GP via a bonding wire BW3 (a third coupling member). In the example shown in FIG. 7, each bonding wire BW1 is coupled to a drain anode line DAL at plural parts CP1s and each bonding wire BW2 is coupled to a cathode line CL at plural parts CP2s.

The first terminal LT1 is coupled to the drains of the transistors TRs and the anodes of the diodes DDs, so that the voltage applied to the first terminal LT1 is higher than the voltages applied to the second terminal LT2 and the third terminal LT3. According to the layout shown in FIG. 7, the second terminal LT2 and the third terminal LT3 can be adequately spaced from the first terminal LT1, so that short-circuiting between them can be inhibited.

The source lines SLs are spaced apart in the y direction in FIG. 7. Therefore, even if it is desired to provide another terminal similar to the first terminal LT1 for coupling to the source electrodes SEs, no space is left available for forming such an additional terminal near the first side or the second side. According to the present embodiment, the potentials of the source electrodes SEs are applied from the chip mounting part DP, so that it is not necessary to provide another terminal for coupling to the source electrodes SEs. This makes terminal layout easy.

Note that, as being described in the following, the transistors TRs need not be structured as shown in FIG. 3.

Figure 8:
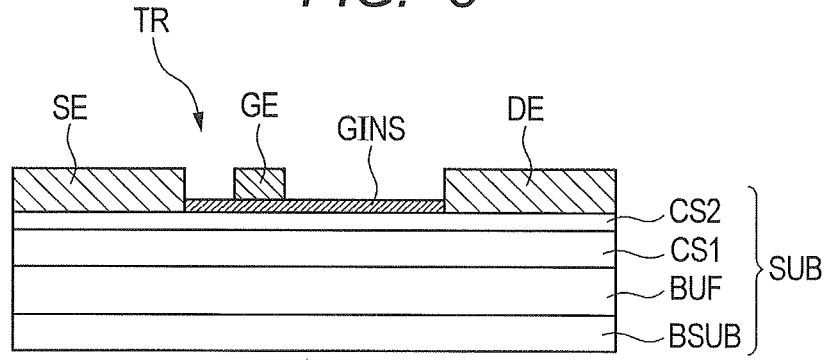
FIG. 8 is a sectional view showing a first modification example of a transistor.

FIG. 8 is a sectional view showing a first modification example of the transistor TR. In the example shown in FIG. 8, no trenches for burying the gate insulating film GINS and the gate electrodes GE are formed in the second compound semiconductor layer CS2, and the gate insulating film GINS and the gate electrode GE are formed over the second compound semiconductor layer CS2. Also, the gate insulating film GINS is formed over the entire region between the source electrode SE and the drain electrode DE formed over the second compound semiconductor layer CS2.

Figure 9:
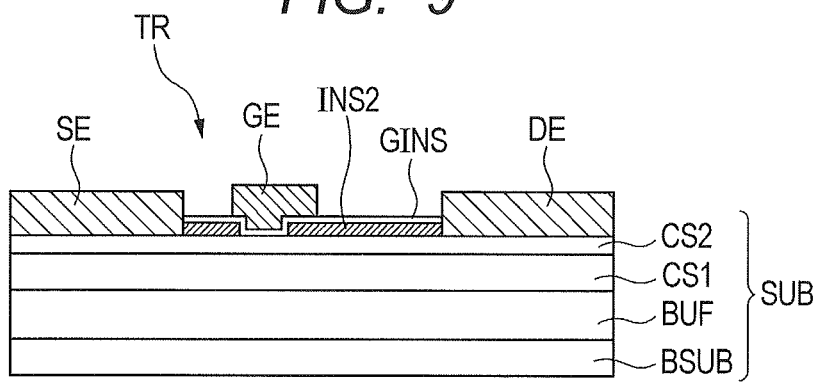
FIG. 9 is a sectional view showing a second modification example of the transistor.

FIG. 9 is a sectional view showing a second modification example of the transistor TR. In the example shown in FIG. 9, the transistor TR is a metal-insulator-semiconductor hetero-junction field-effect transistor (MIS-HJ-FET). To be specific, the gate electrode GE is partly buried in the insulating film INS2 and is coupled to the second compound semiconductor layer CS2 via a gate insulating film GINS. The gate insulating film GINS is formed over the insulating film INS2 and also between the insulating film INS2 and the gate electrode GE. The insulating film INS2 is, for example, a SiN film. In this structure, the two-dimensional electron gas formed on the first compound semiconductor layer CS1 is kept continuous without becoming discontinuous under the gate electrode GE. This makes the transistor TR normally on (though the characteristic is negative). In a state with a voltage lower than a threshold applied to the gate electrode GE, no current flows to the first compound semiconductor CS1. When a voltage higher than the threshold is applied to the gate electrode GE, a current flows to the first compound semiconductor layer CS1.

Figure 10:
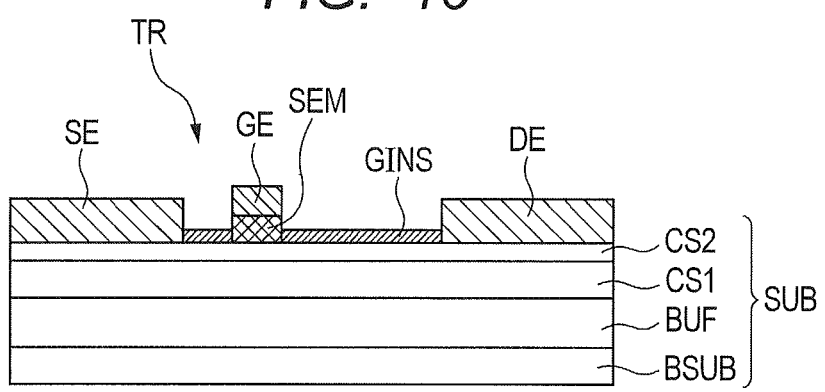
FIG. 10 is a sectional view showing a third modification example of the transistor.

FIG. 10 is a sectional view showing a third modification example of the transistor TR. In the example shown in FIG. 10, the transistor TR is a junction field-effect transistor (J-FET) of a normally-off type. To be specific, a first conductive layer SEM is formed between the second compound semiconductor layer CS2 and the gate electrode GE. The first conductive layer SEM is made of, for example, AlGaN.

As described above, according to the present embodiment, each drain anode line DAL extends between the corresponding transistors TRs and diodes DDs. The drain electrodes DEs are formed to branch from the corresponding drain anode lines DALs toward the corresponding transistors TRs. The anode electrodes AEs are formed to branch from the corresponding drain anode lines DALs toward the corresponding diodes DDs. Therefore, the lines for coupling the drain electrodes DEs and the anode electrodes AEs can be made shorter. This can inhibit the inductances of the lines from causing reduction of the speed of switching between the transistor TRs and the diodes DDs.

Thus, in the semiconductor chip: the diodes DDs and the transistors TRs are respectively arranged in the direction in which the drain anode line DALs extend; and the anode electrodes AEs of the diodes DDs and the drain electrodes DEs of the transistors TRs are formed to respectively branch from the corresponding drain anode lines DALs. This makes it possible to efficiently arrange the diodes DDs and the transistors TRs.

Second Embodiment

Figure 11:
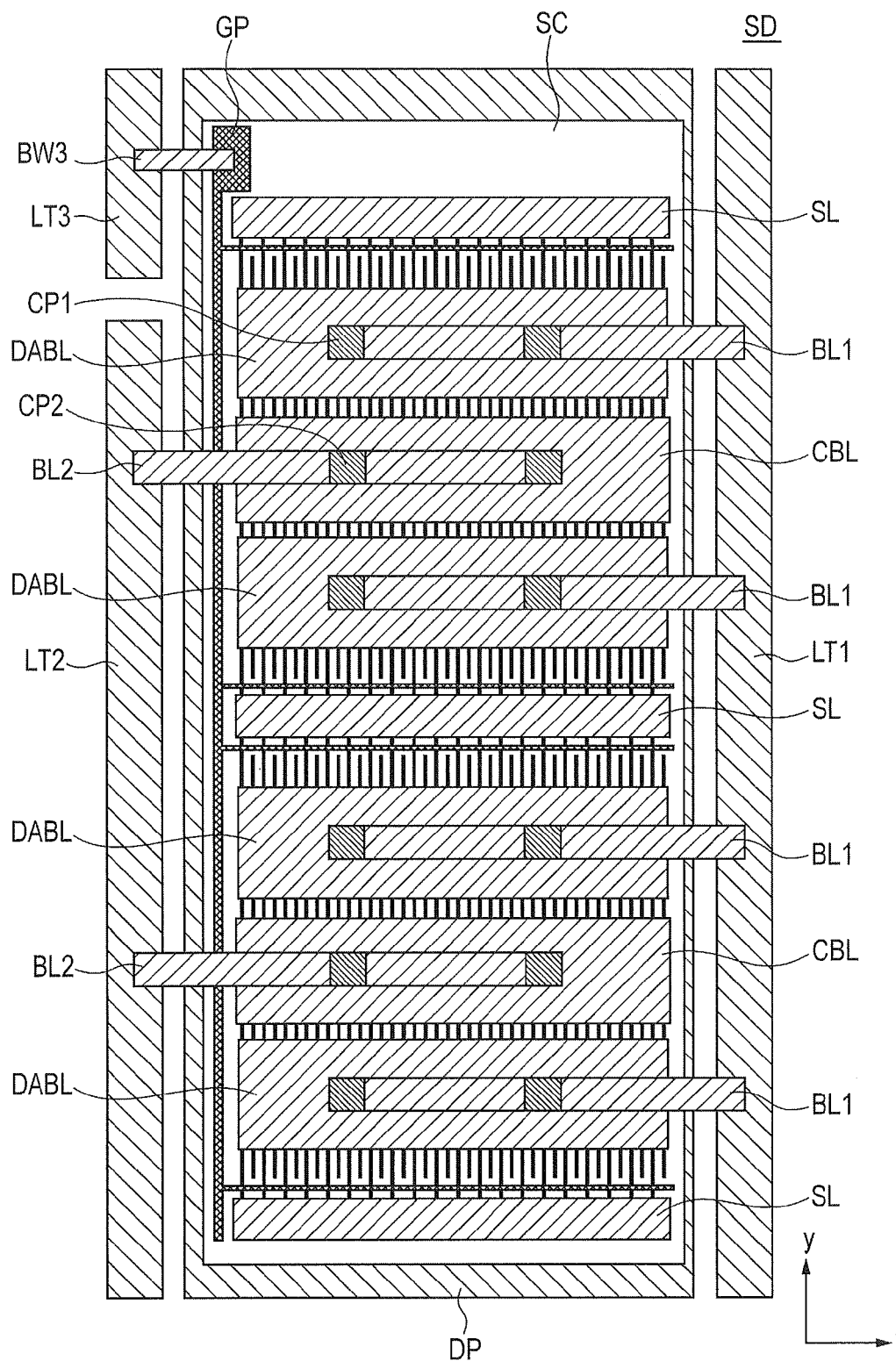
FIG. 11 is a plan view of a semiconductor device according to a second embodiment of the present invention.
Figure 12:
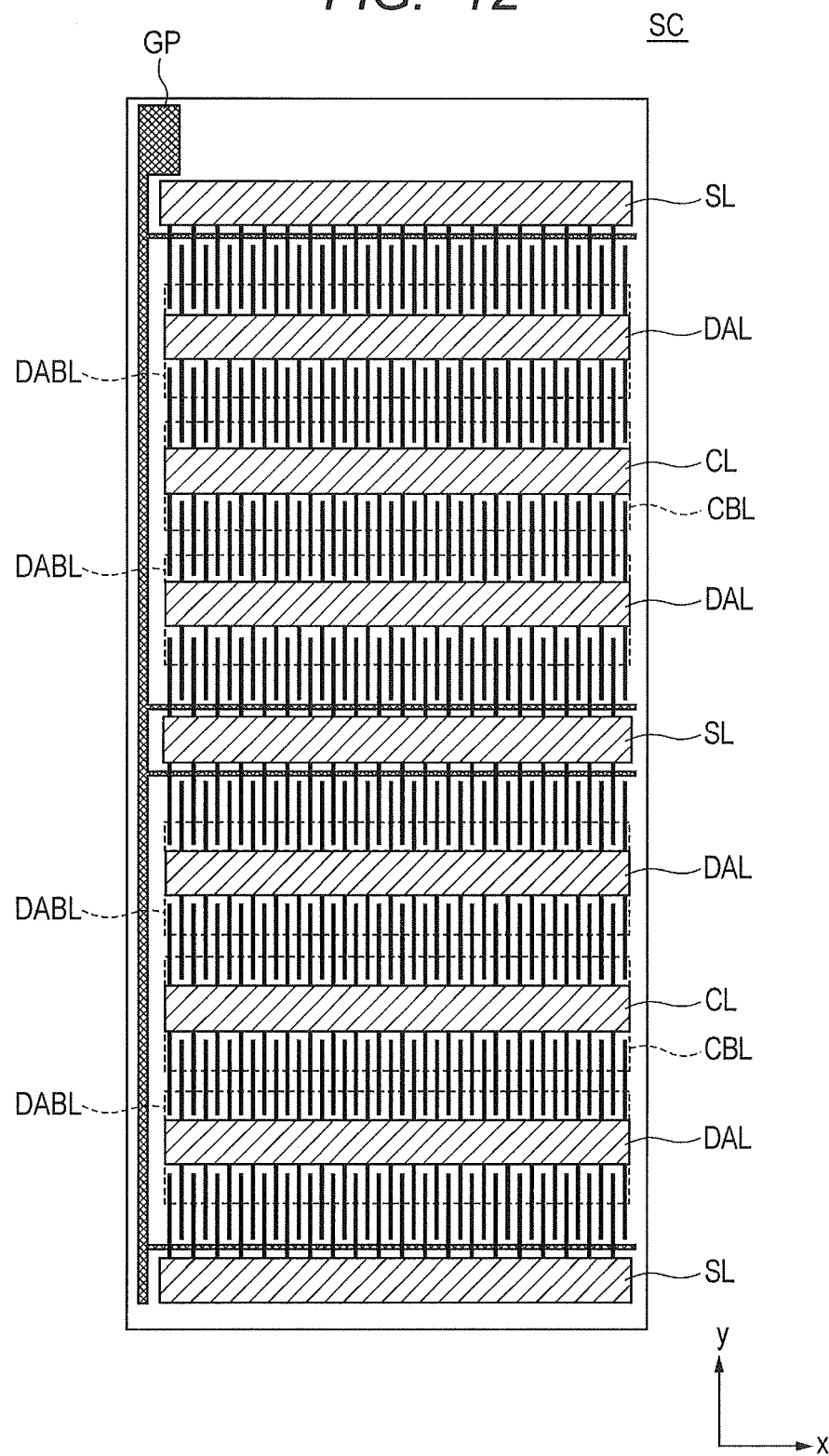
FIG. 12 is a plan view of a semiconductor chip according to the second embodiment of the present invention.
Figure 13:
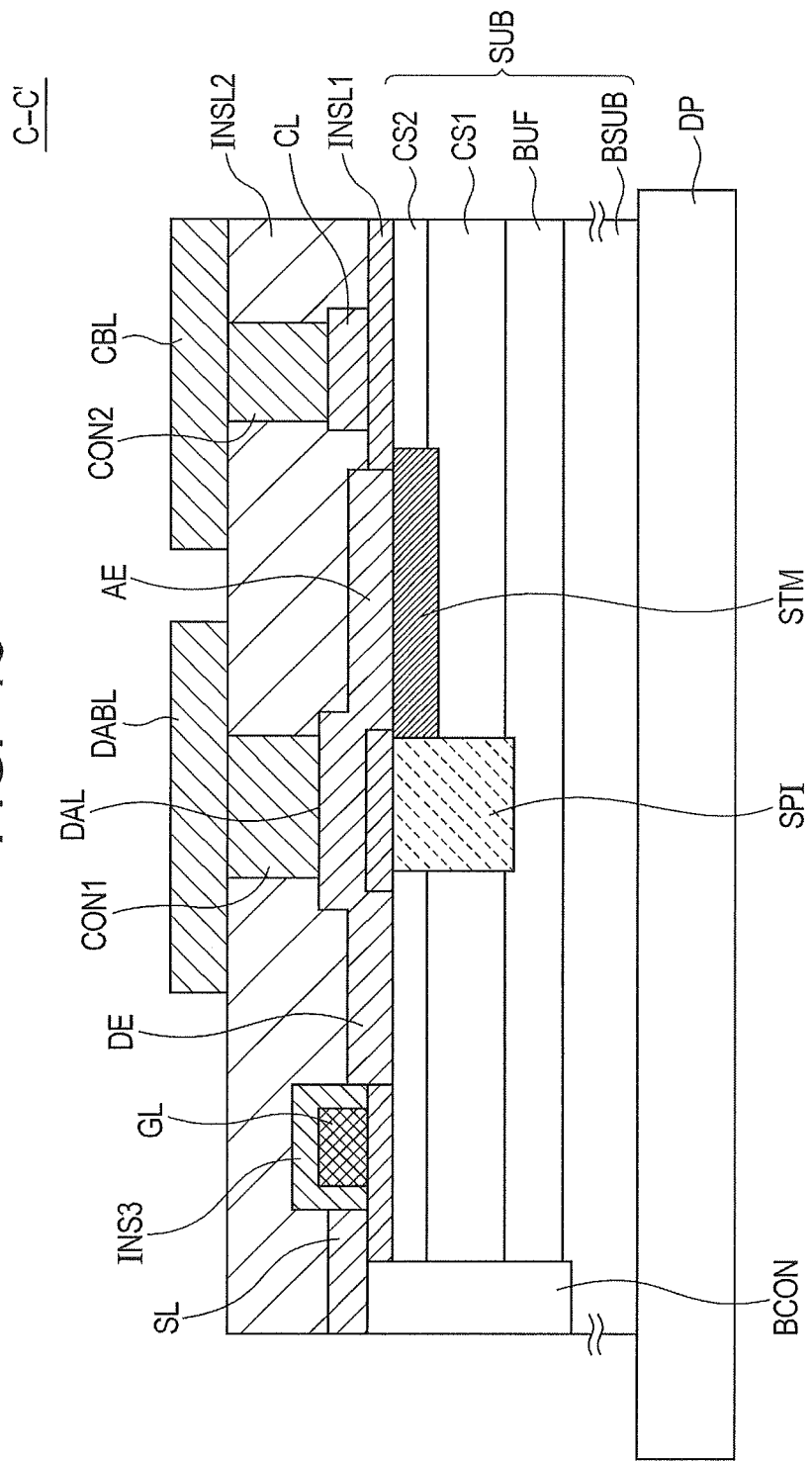
FIG. 13 is a sectional view of the semiconductor chip according to the second embodiment of the present invention.

FIG. 11 is a plan view showing a semiconductor device SD according to a second embodiment of the present invention and corresponds to FIG. 7 for the first embodiment. FIG. 12 is a plan view of the semiconductor chip SC included in the semiconductor device SD shown in FIG. 11. FIG. 13 is a sectional view of the semiconductor chip SC according to the present embodiment and corresponds to FIG. 5 for the first embodiment. In FIG. 12, the diode anode bus lines DABLs and cathode bus lines CBLs being described later are represented in broken lines for descriptive convenience. The semiconductor device SD of the present embodiment is structured identically to the semiconductor device SD of the first embodiment except for the following.

First, as shown in FIG. 13, an interlayer insulating film INSL2 is formed over the source line SL, drain anode line DAL, cathode line CL, and gate line GL. The interlayer insulating film INSL2 is, for example, a silicon oxide film.

As shown in FIGS. 11, 12, and 13, diode-anode bus lines DABLs and cathode bus lines CBLs are formed over the interlayer insulating film INSL2. The diode anode bus lines DABLs and the cathode bus lines CBLs extend in the same direction as the drain anode line DALs and the cathode lines CLs (the second direction: the x direction in FIG. 11).

In a plan view, each diode anode bus line DABL at least partly overlaps a drain anode line DAL, and each cathode bus line CBL at least partly overlaps a cathode line CL. Each portion between a diode anode bus line DABL and a drain anode line DAL of the interlayer insulating film INSL2 has a contact CON1 buried therein, and each portion between a cathode bus line CBL and a cathode line CL of the interlayer insulating film INSL2 has a contact CON2 buried therein. Namely, each diode anode bus line DABL is coupled to a drain anode line DAL via a contact CON1, and each cathode bus line CBL is coupled to a cathode line CL via a contact CON2. The diode anode bus lines DABLs are for reducing the apparent resistances of the drain anode lines DALs, and the cathode bus lines CBLs are for reducing the apparent resistance of the cathode lines CLs.

In the first direction (the y direction in FIG. 11), the diode anode bus lines DABLs are thicker than the drain anode lines DALs, and the cathode bus lines CBLs are thicker than the cathode lines CLs. In a plan view: each diode anode bus line DABL overlaps apart of a transistor region TRR and a part of a diode region DDR; and each cathode bus line CBL overlaps a part of a diode region DDR. This can reduce the area of the semiconductor chip SC.

Each diode anode bus line DABL is coupled to the first terminal LT1 via a bonding ribbon BL1. Each cathode bus line CBL is coupled to the second terminal LT2 via a bonding ribbon BL2. The bonding ribbons BL1s and BL2s are thicker and lower in resistance than the bonding wires BW1s and BW2s used in the first embodiment. The width of each of the bonding ribbons BL1s and BL2s is, for example, 10 or more times larger than the thickness of each of the bonding ribbons BL1s and BL2s.

The present embodiment brings about advantageous effects similar to those of the first embodiment. In the present embodiment, the cathode bus lines CBLs and the diode anode bus lines DABLs are formed, and the bonding ribbons BL1s and BL2s are used. This makes it possible to reduce the resistances between the first terminal LT1 and the drain anode lines DALs and between the second terminal LT2 and the cathode lines CLs. Also, in a plan view, each diode anode bus line DABL overlaps a part of a transistor region TRR and apart of a diode region DDR, and each cathode bus line CBL overlaps a part of a diode region DDR. This can reduce the area of the semiconductor chip SC.

The invention made by the present inventors has been described in concrete terms based on exemplary embodiments. The present invention is not limited to the exemplary embodiments and can be modified in various ways without departing from the scope thereof.

What is claimed is:

1. A semiconductor device, comprising:
   a substrate;
   a plurality of transistors formed on a transistor region of the substrate;
   a plurality of diodes formed on a diode region of the substrate, the transistors and the diodes being arranged in a first direction,
   a first line formed over the substrate and extending between the transistors and the diodes;
   a plurality of first branch lines extending from the first line in the first direction to form a drain electrode of the transistors;
   a plurality of second branch lines extending from the first line in the first direction to form an anode electrode of the diodes; and
   an insulating separation layer formed in the substrate under the first line and separating the transistor region and the diode region.

2. The semiconductor device according to claim 1, wherein drains and sources of the transistors are alternately disposed in a direction along the first line,
   wherein the first branch lines are disposed spaced apart from one another,
   wherein anodes and cathodes of the diodes are alternately disposed in a direction along the first line, and
   wherein the second branch lines are disposed spaced apart from one another.

3. The semiconductor device according to claim 2, further comprising:
   a second line extending, on a side opposite to the first line across the transistors, in the direction in which the first line extends;
   a plurality of third branch lines extending from the second line in the first direction to form a source electrode of the transistors, the third branch lines being disposed to oppose the first branch lines;
   a third line extending, on a side opposite to the first line across the diodes, in the direction in which the first line extends; and
   a plurality of fourth branch lines extending from the third line in the first direction to form a cathode electrode of the diodes, the fourth branch lines being disposed to oppose the second branch lines.

4. The semiconductor device according to claim 3, wherein the first branch lines are coupled to the drains of the transistors,
   wherein the third branch lines are coupled to the sources of the transistors,
   wherein the second branch lines are coupled to the anodes of the diodes, and
   wherein the fourth branch lines are coupled to the cathodes of the diodes.

5. The semiconductor device according to claim 3, wherein, in the first direction, the second line, the transistors, the first line, the diodes, the third line, the diodes, the first line, and the transistors are repeatedly disposed in this order, and
   wherein the fourth branch lines extend from two sides of the third line.

6. The semiconductor device according to claim 3, wherein the substrate is rectangular,
   wherein a first side and a second side opposing the first side of the substrate extend in the first direction, and
   the semiconductor device further comprising:
   a first lead terminal opposing the first side;
   a second lead terminal opposing the second side;
   a first coupling member coupling the first line to the first lead terminal; and
   a second coupling member coupling the third line to the second lead terminal.

7. The semiconductor device according to claim 6, further comprising:
   a gate line extending along the second side of the substrate and coupled to the gate electrodes of the transistors;
   a third lead terminal opposing the second side of the substrate; and
   a third coupling member coupling the gate line to the third lead terminal.

8. The semiconductor device according to claim 6, wherein the substrate includes:
　　a semiconductor substrate doped with impurities and having a first surface and a second surface opposing the first surface;
　　a compound semiconductor layer formed over the first surface of the semiconductor substrate; and
　　a buried contact buried in the compound semiconductor layer, the buried contact having a lower portion coupled to the semiconductor substrate and an upper surface coupled to the second line, and
　　wherein the semiconductor device further comprises a substrate mounting part supporting the second surface, the substrate mounting part having at least a conductive surface contacting the second surface of the semiconductor substrate.

9. The semiconductor device according to claim 1, wherein the first line extends in a second direction between the transistors and the diodes, the second direction being perpendicular to the first direction.

10. The semiconductor device according to claim 1, wherein the plurality of first branch lines extend in the first direction from a first side of the first line, and the plurality of second branch lines extend in the first direction from a second side of the first line which is opposite the first side.

11. The semiconductor device according to claim 1, further comprising:
　　a second line extending in a second direction perpendicular to the first direction; and
　　a plurality of third branch lines extending in the first direction from the second line to form a source electrode of the transistors.

12. The semiconductor device according to claim 1, wherein the substrate comprises a buffer layer, a first compound semiconductor layer formed on the buffer layer, and a second compound semiconductor layer formed on the first compound semiconductor layer, and
　　wherein the insulating separation layer is formed in the first and second compound semiconductor layers.

13. The semiconductor device according to claim 1, further comprising:
　　a Schottky metal formed in the substrate under the anode electrode and adjacent to the insulating separation layer.

14. The semiconductor device according to claim 1, further comprising:
　　an insulating film formed on a surface of the substrate between the insulating separation layer and the first line.

15. A semiconductor device, comprising:
　　a substrate;
　　a plurality of transistors formed on the substrate;
　　a plurality of diodes formed on the substrate, the transistors and the diodes being arranged in a first direction;
　　a first line formed over the substrate and extending between the transistors and the diodes;
　　a plurality of first branch lines extending from the first line in the first direction to form a drain electrode of the transistors;
　　a plurality of second branch lines extending from the first line in the first direction to form an anode electrode of the diodes;
　　a second line extending in a second direction perpendicular to the first direction; and
　　a plurality of third branch lines extending in the first direction from the second line to form a source electrode of the transistors;
　　a third line extending in the second direction; and
　　a plurality of fourth branch lines extending in the first direction from the third line to form a cathode electrode of the diodes.

16. A semiconductor device, comprising:
　　a transistor region comprising a plurality of transistors formed on a substrate;
　　a diode region comprising a plurality of diodes formed on the substrate;
　　a first line formed between the transistor region and the diode region;
　　a plurality of first branch lines extending from the first line into the transistor region to form a drain electrode of the plurality of transistors; and
　　a plurality of second branch lines extending from the first line into the diode region to form an anode electrode of the plurality of diodes; and
　　an insulating separation layer formed in the substrate under the first line and separating the transistor region and the diode region.

17. The semiconductor device according to claim 16, wherein the plurality of first branch lines extend from a first side of the first line, and the plurality of second branch lines extend from a second side of the first line which is opposite the first side.

18. The semiconductor device according to claim 16, wherein the plurality of first branch lines and the plurality of second branch lines extend in a first direction, and
　　wherein the first line extends in a second direction between the transistor region and the diode region, the second direction being perpendicular to the first direction.

19. The semiconductor device according to claim 18, further comprising:
　　a second line extending in the second direction; and
　　a plurality of third branch lines extending from the second line into the transistor region to form a source electrode of the plurality of transistors.

20. The semiconductor device according to claim 19, further comprising:
　　a third line extending in the second direction; and
　　a plurality of fourth branch lines extending from the third line into the diode region to form a cathode electrode of the plurality of diodes.

* * * * *